United States Patent
Dening et al.

(10) Patent No.: US 6,313,705 B1
(45) Date of Patent: Nov. 6, 2001

(54) BIAS NETWORK FOR HIGH EFFICIENCY RF LINEAR POWER AMPLIFIER

(75) Inventors: David C. Dening, Stokesdale; Jon D. Jorgenson, Greensboro, both of NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/467,415

(22) Filed: Dec. 20, 1999

(51) Int. Cl.[7] ........................................ H03F 3/04
(52) U.S. Cl. ..................... 330/276; 330/285; 330/288; 330/289
(58) Field of Search ................................... 330/285, 288, 330/296, 289

(56) References Cited

U.S. PATENT DOCUMENTS

| | | | |
|---|---|---|---|
| 3,708,756 | 1/1973 | Fajen | 330/29 |
| 3,896,394 | 7/1975 | Baro | 330/23 |
| 3,906,386 | 9/1975 | Hongu et al. | 330/22 |
| 3,984,783 | 10/1976 | Bickley | 330/40 |
| 4,079,336 | 3/1978 | Gross | 330/296 |
| 4,122,403 | 10/1978 | Cave | 330/289 |
| 4,207,538 | 6/1980 | Goel | 330/277 |
| 4,283,641 | 8/1981 | Skingley | 307/297 |
| 4,467,290 | 8/1984 | Cozzi | 330/290 |
| 4,728,902 | 3/1988 | Gleason et al. | 330/261 |
| 4,924,194 | 5/1990 | Opas et al. | 330/289 |
| 5,150,076 | * 9/1992 | Asazawa | 330/296 |
| 5,345,192 | 9/1994 | Green | 330/289 |
| 5,404,585 | 4/1995 | Vimpari et al. | 455/115 |
| 5,436,595 | 7/1995 | Wholey et al. | 330/296 |
| 5,471,174 | 11/1995 | Petty et al. | 330/257 |
| 5,654,672 | 8/1997 | Bailey et al. | 330/289 |
| 5,670,912 | 9/1997 | Zocher | 330/296 |
| 5,710,522 | 1/1998 | Pass | 330/291 |
| 5,736,901 | 4/1998 | Nakamura et al. | 330/296 |
| 5,739,723 | 4/1998 | Sigmon et al. | 330/295 |
| 5,963,096 | * 10/1999 | Hoshino | 330/296 |
| 6,043,714 | * 3/2000 | Yamamoto et al. | 330/296 |
| 6,052,032 | * 4/2000 | Järvinen | 330/296 |
| 6,148,220 | * 11/2000 | Sharp et al. | 330/285 |

FOREIGN PATENT DOCUMENTS 11-68473 * 3/1999 (JP) .

* cited by examiner

*Primary Examiner*—Michael B Shingleton
(74) *Attorney, Agent, or Firm*—Withrow & Terranova, PLLC

(57) ABSTRACT

A bias network uses resistive biasing, active biasing and current mirror biasing in combination to enhance RF power amplifier linearity and efficiency by forming a bias network that provides temperature compensation, minimizes current drain requirements for the Vbias source and reduces the level of RF linear amplifier quiescent current.

14 Claims, 13 Drawing Sheets

Active Bias

Buffered Passive Bias

Current Mirror Bias

Current Mirror Bias

Buffered Passive with Diode Reference

BIAS NETWORK FOR HIGH EFFICIENCY RF LINEAR POWER AMPLIFIER

BACKGROUND OF THE INVENTION (1) Field of the Invention

The present invention relates generally to radio frequency (RF) linear power amplifier bias networks and, more particularly, to a bias network for minimizing distortion products normally associated with bipolar transistor based RF power amplifiers.

(2) Description of the Prior Art

An important goal associated with design of bipolar transistor based linear amplifiers includes minimizing the introduction of distortion products. It is known that load impedance can be optimized for minimum distortion. Optimization of just the load impedance, however, is often undesirable since the output power and efficiency generally are reduced. It is also known that any bias network must supply the correct amount of bipolar transistor base current to prevent or minimize distortion. Two trends associated with bipolar transistor base current must be reconciled to produce a linear amplifier with minimum amplitude modulation (AM) distortion, e.g. AM-to-AM. For example, the bias current required by a bipolar transistor in class B operation increases as the square root of the power. Further, the base current, and thus the collector current increases exponentially with increasing base-emitter voltage. Any reduction in distortion products will allow a linear amplifier to be operated closer to saturation, thereby improving the efficiency.

When a linear amplifier bias point is chosen very close to a class B mode, efficiency can be improved. This condition, however, places a heavy demand on the associated bias network to supply a large range of bias currents as the linear amplifier power requirements vary. Two approaches have been used in the art to provide the requisite bias network. First, a resistive bias network has been used where the base current is supplied through a bias resistor. Second, an active bias network has been used where an emitter follower transistor is used to provide a low impedance bias supply. The resistive bias approach provides limited bias current control over power. For example, if the resistor is small, temperature variations will cause unacceptable fluctuations in the quiescent current unless the bias network supply voltage also changes with temperature. If the resistor is large, the linear amplifier will be have insufficient bias current at high drive levels or have a large quiescent bias current which is undesirable. The active bias network allows an RF device to draw varying amounts of bias current depending upon the RF drive while maintaining a low quiescent level. The foregoing bias networks, therefore, can affect the linearity of an RF amplifier.

As stated above, one measure of linearity is AM-to-AM distortion due to RF amplifier gain changes that occur as the RF amplifier power level changes. The gain of an amplifier with resistive biasing will decrease as the power increases since the bias resistor will not pass the increased base current. Amplifiers with active biasing, however, will exhibit gain expansion since the effective bias current will increase at a larger rate than that required as the power is increased. This condition occurs because the average impedance looking back into the emitter of the bias current supply transistor decreases as the current increases.

In view of the above, a temperature compensated amplifier quiescent current is desirable since it helps maintain linearity and efficiency over the desired operating range of the amplifier. One technique that has been used to produce temperature compensation at a specific bias voltage includes a combination of resistive biasing and active biasing referred to in the art as "buffered passive bias." The buffered passive bias scheme reduces the current that must be supplied by the bias network voltage source. Another technique that has often been used to produce temperature compensation includes a current mirror bias network. The current mirror bias network provides bias current control over a wide temperature range, but requires higher levels of current from the bias network voltage source. In one case, thermal variations in the amplifier output transistor quiescent current, when using a current mirror bias network, track current changes through a collector bias resistor as the base-emitter voltage associated with the current mirror transistor and amplifier transistor change over temperature. If the bias network voltage is large compared to the base-emitter voltages, then the quiescent current will not change much over temperature.

The above techniques, familiar to those skilled in the art of linear amplifiers, affect the AM-to-AM linearity performance of the amplifier. As known in the art, amplifier performance limitations are affected by impedance variations seen looking back into the bias and RF matching networks. In one known embodiment, the amplifier output transistor collector current varies exponentially with its base-emitter voltage, as stated above. Therefore, a large RF impedance at the amplifier output transistor base is desirable for linearity since it will behave more like a constant current source. Use of a large RF impedance, however, is not desirable to achieve optimum energy transfer. One known technique that addresses the foregoing problems includes setting the value of an input RF coupling capacitor to the requisite value to achieve desired RF performance with the understanding that a higher impedance (smaller capacitor value) will achieve better linearity.

In class B operation, one requirement placed upon the associated bias network includes metering charge into an input RF coupling capacitor on the negative portion of the RF cycle at a rate that increases as the square root of the RF power. This charge is then pumped into the amplifier transistor base during the positive portion of the RF cycle. As stated above, a factor in controlling amplifier linearity is the impedance of the bias network. Other than the resistive bias technique, known biasing techniques discussed above generally have impedances that are too low. This characteristic generally tends to supply charge (current) to the input RF coupling capacitor discussed above at a higher rate than needed as the power increases and thus produces unwanted gain expansion. While the linearity performance of a resistive bias amplifier can be optimal, such techniques generally require excessive bias current from the bias network voltage source.

Thus, there remains a need for a new and improved bias network suitable for use with bipolar transistor power amplifiers and that effectively minimizes distortion products to achieve optimum linearity while substantially preserving efficiency.

SUMMARY OF THE INVENTION

The present invention is directed to a bias network configured to control AM-to-AM performance for a bipolar linear amplifier. One embodiment comprises a modified buffered passive bias network in combination with a modified current mirror bias network. The modified buffered passive bias network provides temperature compensation and minimizes current drain requirements associated with the bias network voltage source. The modified current mirror aids in the temperature compensation and in reducing the level of bipolar linear amplifier quiescent current. The impedance of the modified buffered passive bias network is adjusted through a conventional bias resistor in combination with an impedance adjusting resistor added to the emitter of the active bias transistor. The impedance of the modified current mirror bias network is adjusted substantially via a resistor added to the base of the current mirror bias transistor and also to a lesser extent via a resistor added to the collector of the current mirror bias transistor.

Another embodiment comprises a modified buffered passive bias network as described above in combination with a modified current mirror bias network in which an inductor is added to the emitter of the current mirror bias transistor.

Yet another embodiment comprises a modified buffered passive bias network as described above in combination with a modified current mirror bias network as also described above in which the bias network voltage source is provided via a voltage drop across a plurality of diodes.

Still another embodiment comprises a modified buffered passive bias network as described above in combination with a modified current mirror bias network as also described above in which the bias network voltage source is provided via a voltage drop across a plurality of diode connected transistors (base/collector connected) to provide a temperature variable reference voltage.

Another embodiment comprises a modified buffered passive bias network as described above in combination with a modified current mirror bias network as also described above in which the bias network voltage source is provided via a voltage drop across at least one diode connected transistor in combination with one or more resistors to provide a temperature variable reference voltage.

Another embodiment comprises a modified buffered passive bias network as described above in which the bias network voltage source is provided by a diode reference network as also described above.

Accordingly, one feature of the present invention includes provision of a current bias network configured to minimize introduction of distortion products associated with a bipolar linear amplifier.

Another feature of the present invention includes provision of a current bias network configured to allow a bipolar linear amplifier to be operated very close to saturation to improve amplifier efficiency.

Still another feature of the present invention includes provision of a bipolar linear amplifier current bias network configured to provide temperature compensation and minimize current drain requirements associated with the current bias network.

Yet another feature of the present invention includes provision of a bipolar linear amplifier current bias network configured to provide temperature compensation and reduce the level of quiescent current drain requirements associated with the bipolar linear amplifier.

Still another feature of the present invention includes provision of a current bias network that can be combined with a bipolar linear amplifier to produce a linear amplifier with minimum AM-to-AM distortion.

These and other features of the present invention will become apparent to those skilled in the art after a reading of the following description of the preferred embodiment when considered with the drawings.

DESCRIPTION OF THE PREFERRED EMBODIMENTS

Figure 1:
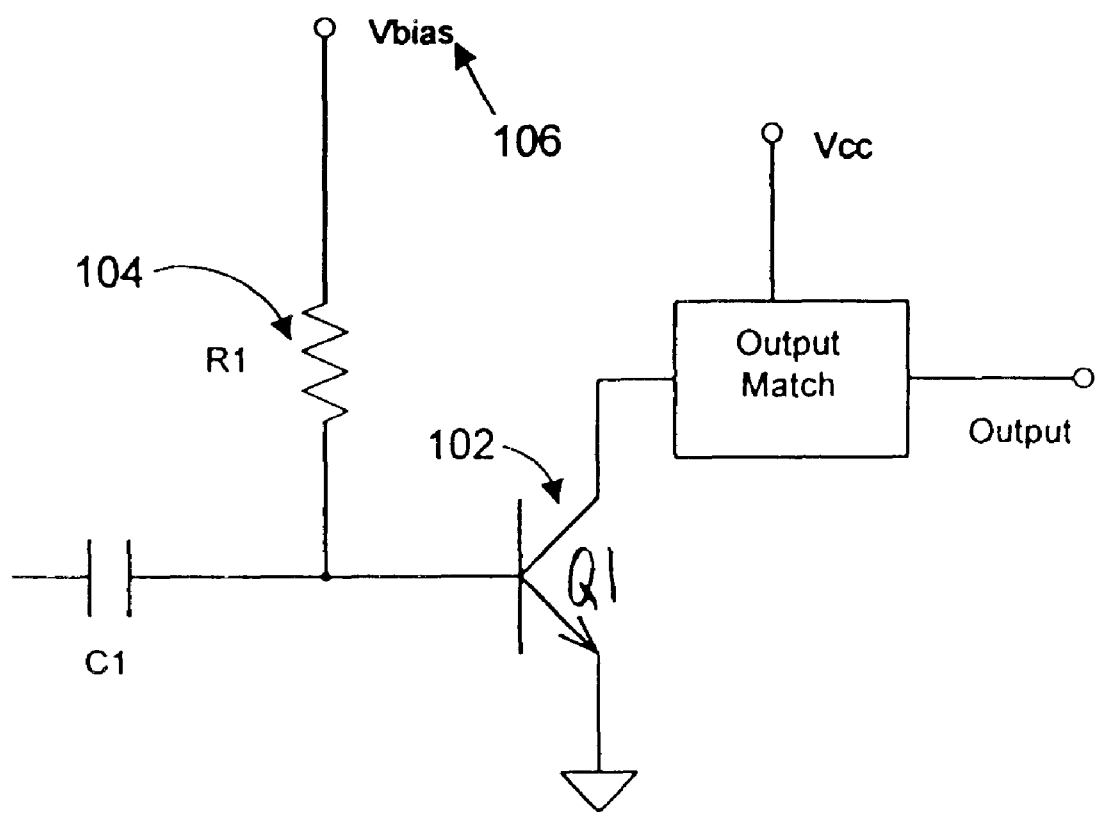
FIG. 1 is a schematic diagram illustrating a resistive bias network known in the art.

In the following descriptions, like reference characters designate like or corresponding parts throughout the several views. Referring now to the drawings in general and FIG. 1 in particular, it will be understood that the illustrations are for the purpose of describing a preferred embodiment of the invention and are not intended to limit the invention thereto. As shown in FIG. 1, a schematic diagram illustrates a resistive bias circuit 100 known in the art. The base current to a transistor amplifier 102 is supplied through a bias resistor 104. This biasing approach provides limited bias current control over power. For example, if the bias resistor 104 is small, temperature variations can cause unacceptable fluctuations in the quiescent current associated with the transistor amplifier 102 unless the bias voltage Vbias 106 changes with temperature. If the bias resistor 104 is large, the transistor amplifier 102 will be bias starved at high drive levels or otherwise have an undesirably large quiescent bias current.

Figure 2:
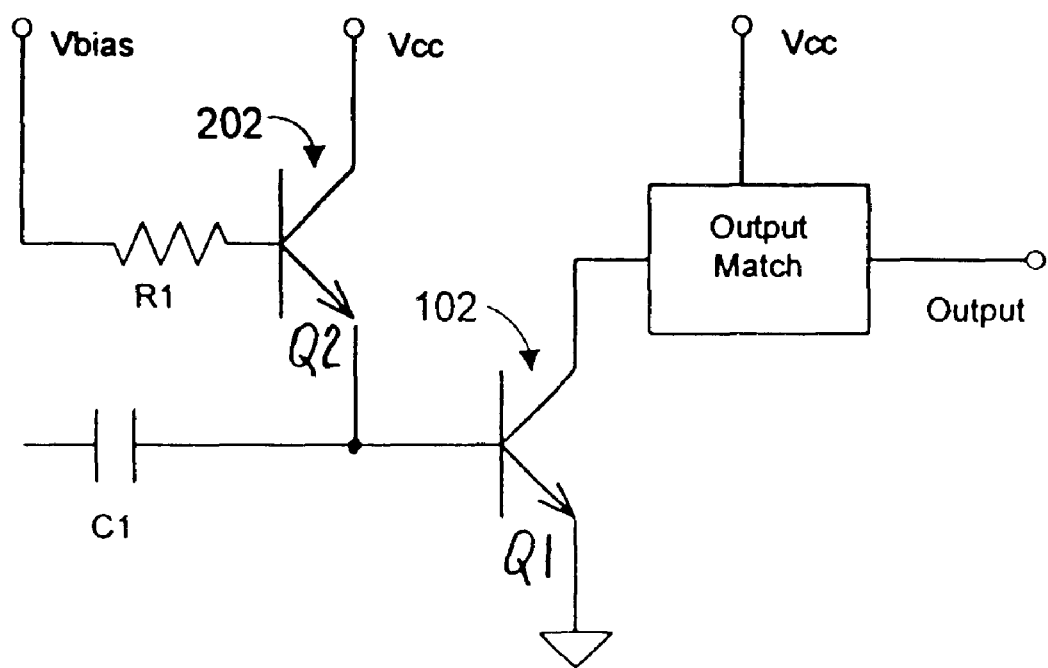
FIG. 2 is a schematic diagram illustrating an active bias network known in the art.

FIG. 2 is a schematic diagram illustrating an active bias circuit 200 known in the art. The active bias circuit 200 is an improvement over the resistive bias circuit 100 shown in FIG. 1 since the active bias circuit 200 allows the associated transistor amplifier 102 to draw varying amounts of bias current depending upon the radio frequency (RF) drive level while still maintaining a low quiescent current level. The resistive bias circuit 100 and the active bias circuit 200 both affect the transistor amplifier 102 linearity, e.g., AM-to-AM distortion, due to transistor gain changes with changes in power level. For example, amplifier gain with resistive bias will decrease as the power level increases since the resistor 104 will not pass the increased base current as stated above. Amplifiers having active biasing will exhibit gain expansion with increasing power levels. This is because the effective bias current will increase at a larger rate than required due to decreasing average impedance (variable impedance) associated with the bias current supply transistor 202 as the current increases.

Figure 3:
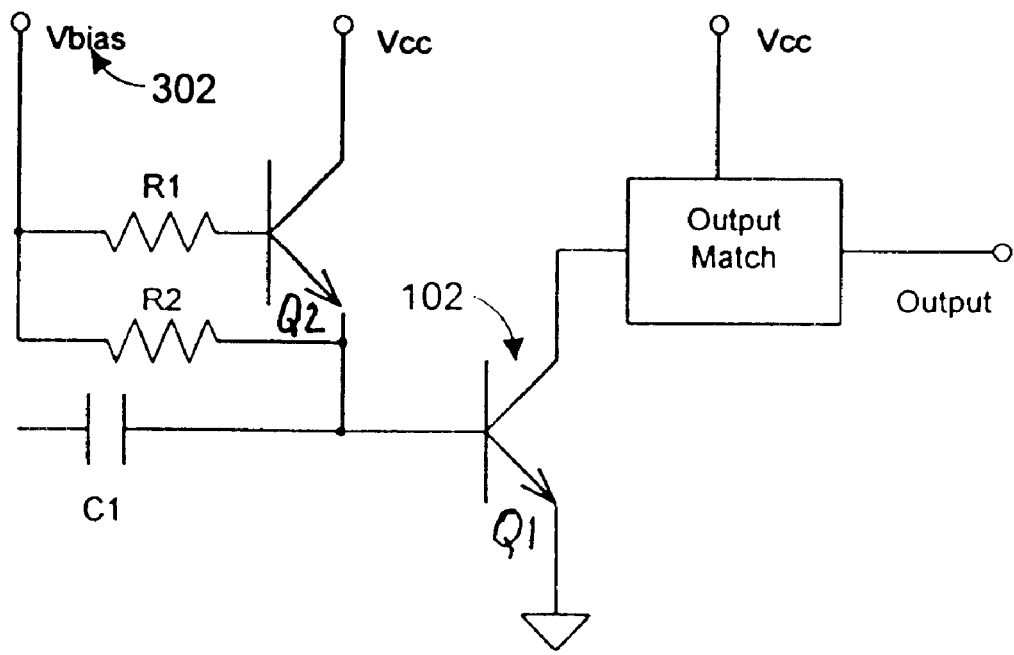
FIG. 3 is a schematic diagram illustrating a buffered passive bias network known in the art.

FIG. 3 is a schematic diagram illustrating a buffered passive bias circuit 300 known in the art. As stated above, temperature compensation in the transistor amplifier 102 quiescent current is desirable since it helps maintain linearity and efficiency over the operating range of the amplifier 102. The buffered passive bias circuit 300 combines a resistive bias circuit 100 with an active bias circuit 200 to produce improved temperature compensation at a specific bias voltage. A feature of this active bias circuit 300 includes a reduction in current that must be supplied by the active bias circuit voltage source Vbias 302.

Figure 4:
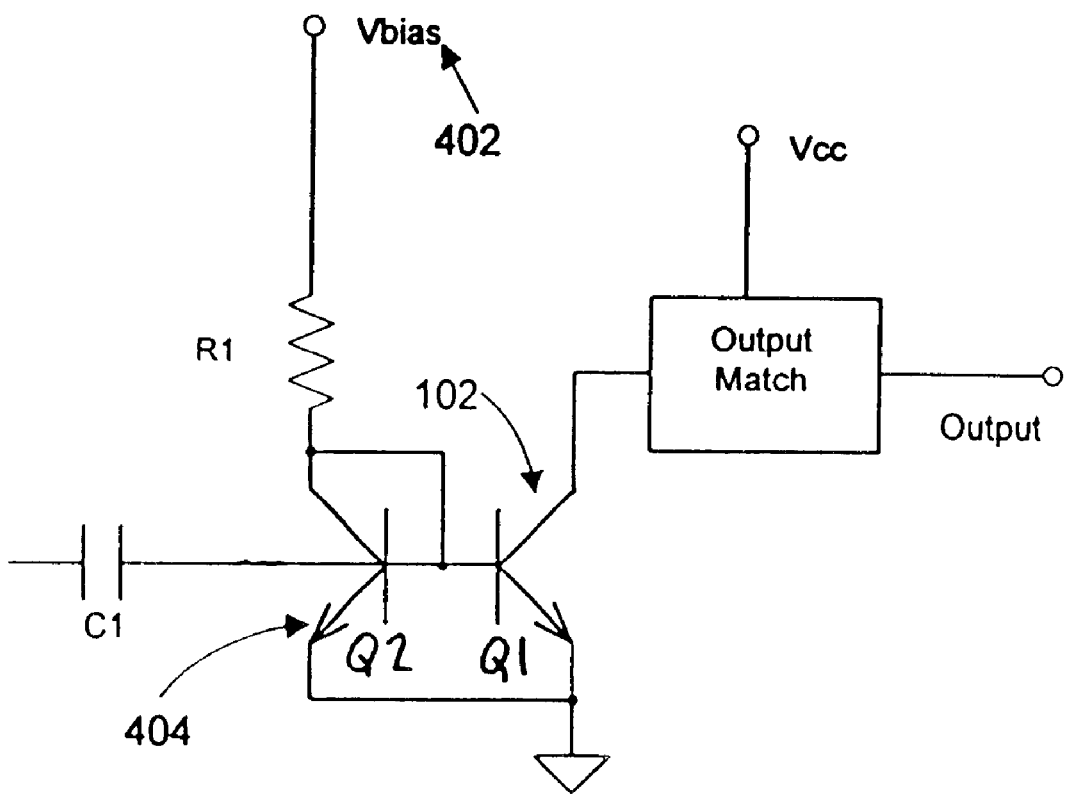
FIG. 4 is a schematic diagram illustrating a current mirror bias network known in the art.

FIG. 4 is a schematic diagram illustrating a current mirror bias circuit 400 known in the art. The current mirror bias circuit 400 provides excellent bias current control over a wide temperature range at the expense of increased current requirements for the current mirror bias circuit voltage source Vbias 402. In operation, the current mirror bias transistor 404 quiescent current tracks the transistor amplifier 102 quiescent current because of the common base-emitter voltage. If the voltage drop across Rl is large compared to the thermal variation in the base-emitter voltage ($V_{BE}$), the quiescent bias current will remain relatively unchanged over temperature.

Figure 5:
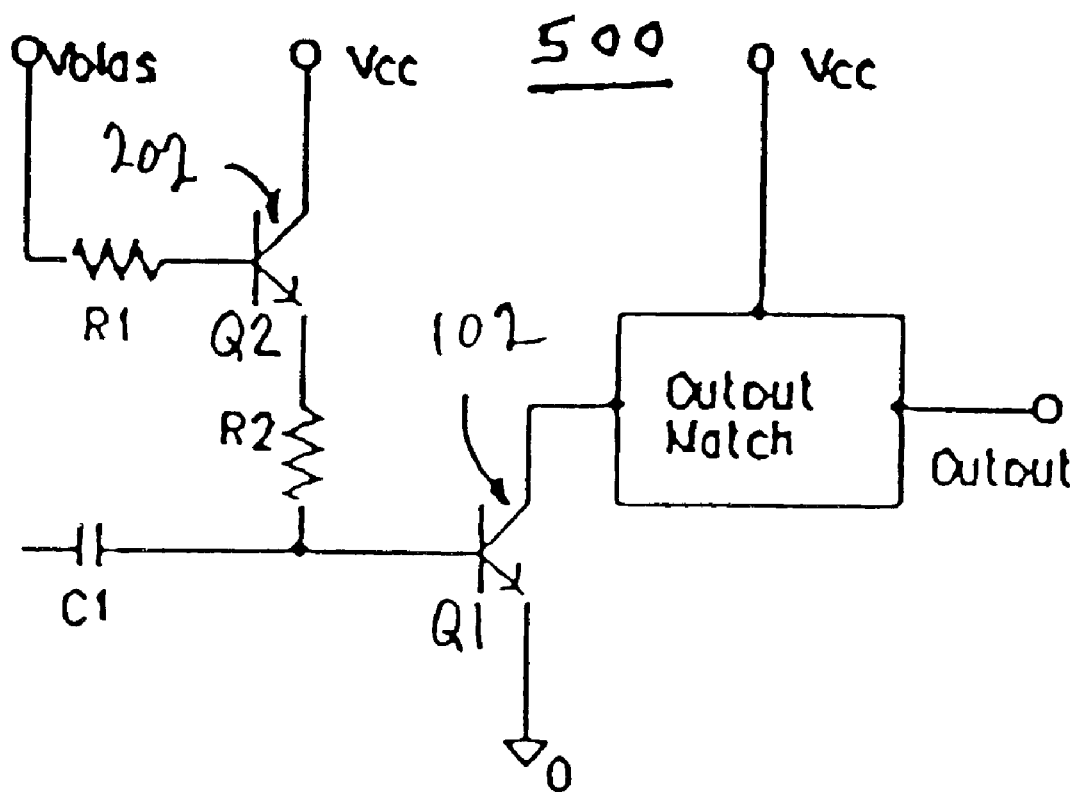
FIG. 5 is a schematic diagram illustrating a modified active bias network according to one embodiment of the present invention.

FIG. 5 is a schematic diagram illustrating a modified active bias circuit 500 according to one embodiment of the present invention. As stated above, a factor in controlling the amplifier linearity is the impedance of the bias network. The bias circuits illustrated in FIGS. 2–4 have impedances that are too low for use in linear amplifier applications. For example, a low impedance will tend to supply charge (current) to capacitor C1 as the power increases, thereby producing gain expansion. The bias circuit illustrated in FIG. 1 could be optimum but for the excessive bias current required from the bias voltage source Vbias 106. The modified active bias circuit 500 includes a resistor R2 added to the emitter of the active bias circuit transistor 202 to reduce or minimize any gain expansion produced by the modified active bias circuit 500. Preferably, resistor R2 is selected to achieve maximum linearity and efficiency about a desired operating point for the transistor amplifier 102.

Figure 6:
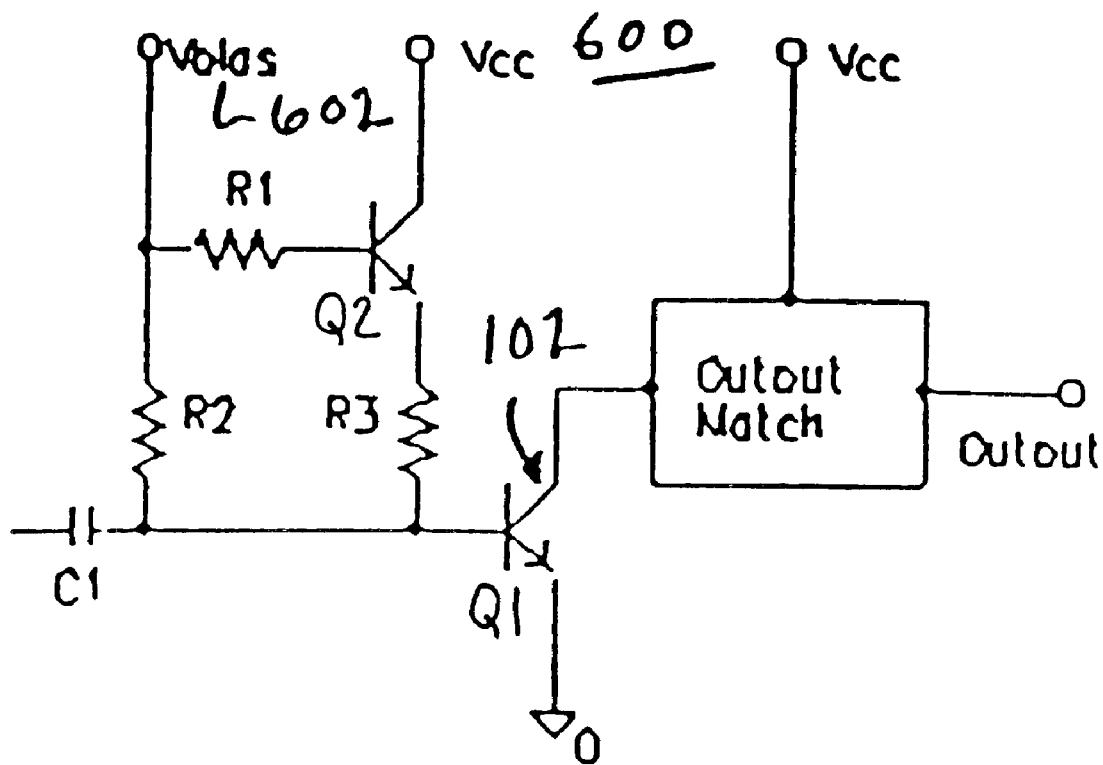
FIG. 6 is a schematic diagram illustrating a modified buffered passive bias network according to one embodiment of the present invention.

FIG. 6 is a schematic diagram illustrating a modified buffered passive bias circuit 600 according to one embodiment of the present invention. The modified passive bias circuit 600 allows adjustments to the bias impedance and a degree of temperature compensation via resistors R2 and R3. Preferably, resistors R2 and R3 are adjusted to maximize transistor amplifier 102 operating efficiency and linearity with minimal quiescent bias current demands upon the bias circuit voltage source 602.

Figure 7:
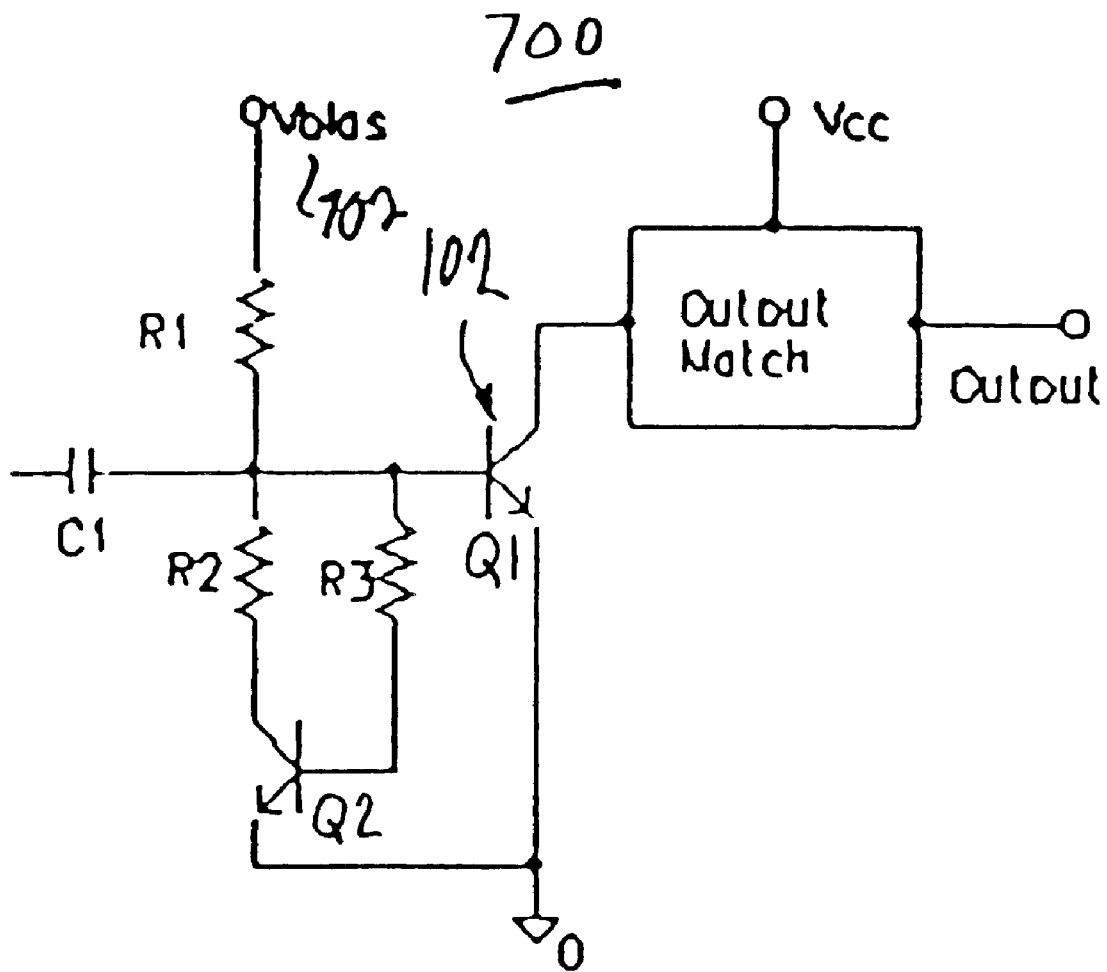
FIG. 7 is a schematic diagram illustrating a modified current mirror bias network according to one embodiment of the present invention.

FIG. 7 is a schematic diagram illustrating a modified current mirror bias circuit 700 according to one embodiment of the present invention. The modified current mirror bias circuit 700 allows adjustments to the bias impedance and a degree of temperature compensation via resistors R1, R2 and R3. For example, resistors R2 and R3 allow adjustments in the temperature compensation characteristics associated with the transistor amplifier 102 while resistors R1, R3 and to a lessor extent R2, all interact to affect the bias circuit impedance. Preferably, resistors R1, R2 and R3 are adjusted to maximize linearity and operating efficiency with minimal quiescent bias current demands upon the modified current mirror bias circuit voltage source 702.

Figure 8:
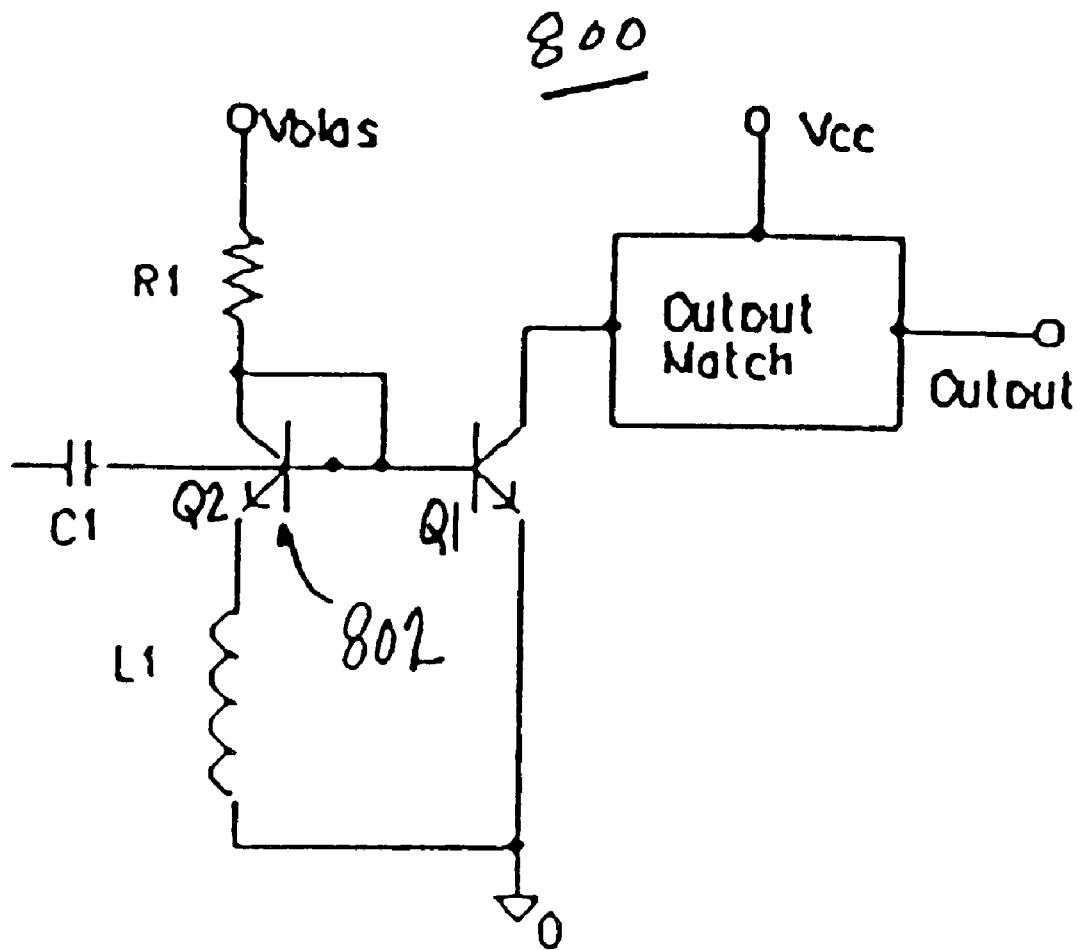
FIG. 8 is a schematic diagram illustrating another modified current mirror bias network according to one embodiment of the present invention.

FIG. 8 is a schematic diagram illustrating another modified current mirror bias circuit 800 according to one embodiment of the present invention. The impedance of the modified current mirror bias circuit 800 can be increased via addition of an inductor L1 to the emitter of the modified current mirror bias transistor 802. Chip area is important when using a monolithic power amplifier. Therefore, it is preferable to provide a connection for use with an external inductor when the modified current mirror bias circuit 800 is used in association with a monolithic power amplifier.

Figure 9:
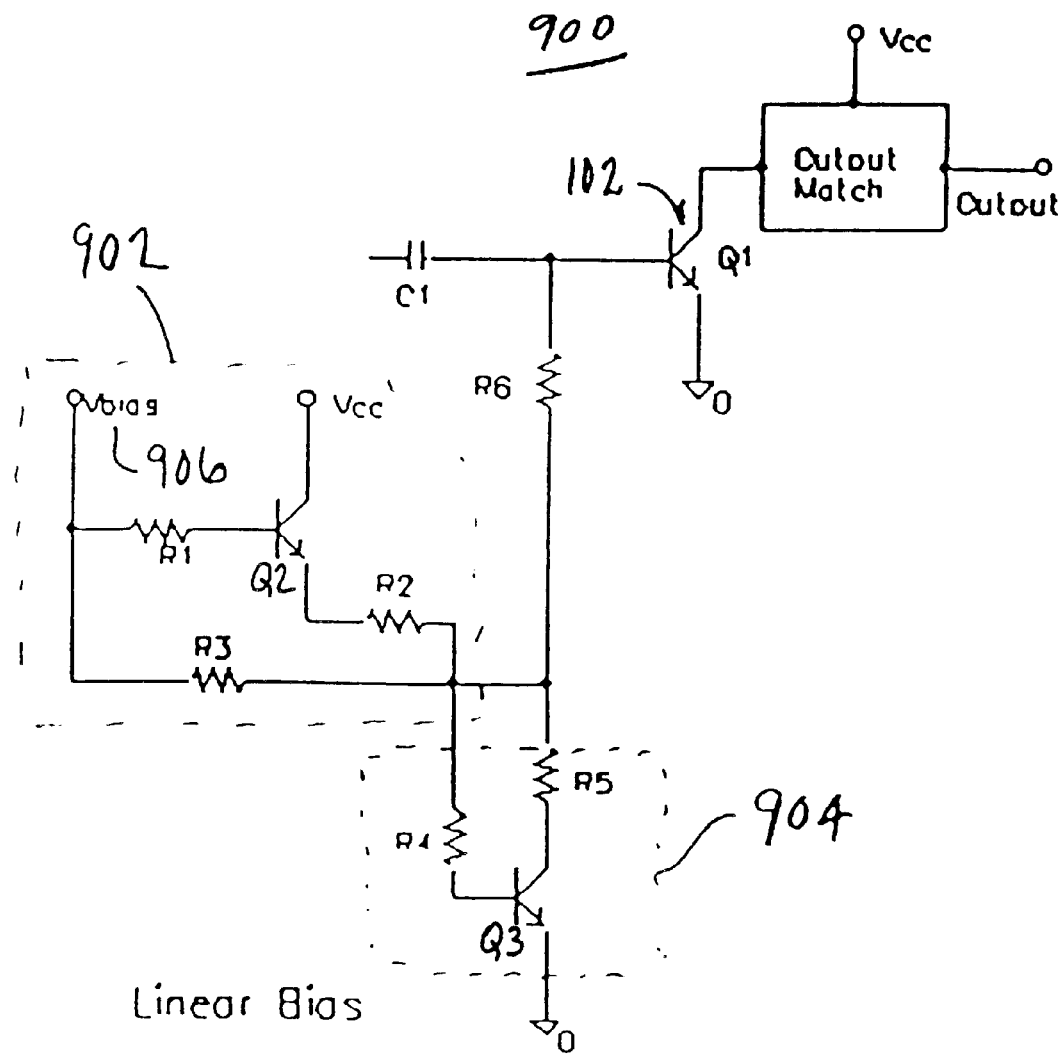
FIG. 9 is a schematic diagram illustrating a current bias network according to one embodiment of the present invention.

FIG. 9 is a schematic diagram illustrating a bias network 900 according to one preferred embodiment of the present invention. The bias network 900 has a modified buffered passive circuit 902 and a modified current mirror bias circuit 904. The modified buffered passive bias circuit 902 provides a predetermined amount of temperature compensation while attributing to minimization of current drain requirements associated with the bias circuit voltage source Vbias 906. The modified current mirror bias circuit 904 aids in the temperature compensation and in reducing the level of quiescent current associated with the transistor amplifier 102. The impedance of the bias network 900 is adjusted through resistors R2, R3, R4 and to a lessor extent resistor R5. The resistor R6 generally provides bias ballast for the transistor amplifier 102 and is typically too small to provide linearity improvements when used in association with the bias network 900. The bias network 900 allows greater flexibility than known bias circuits in providing a bias current source capable of achieving design constraints necessary to create a linear amplifier having superior AM-to-AM performance and temperature compensation.

Figure 10:
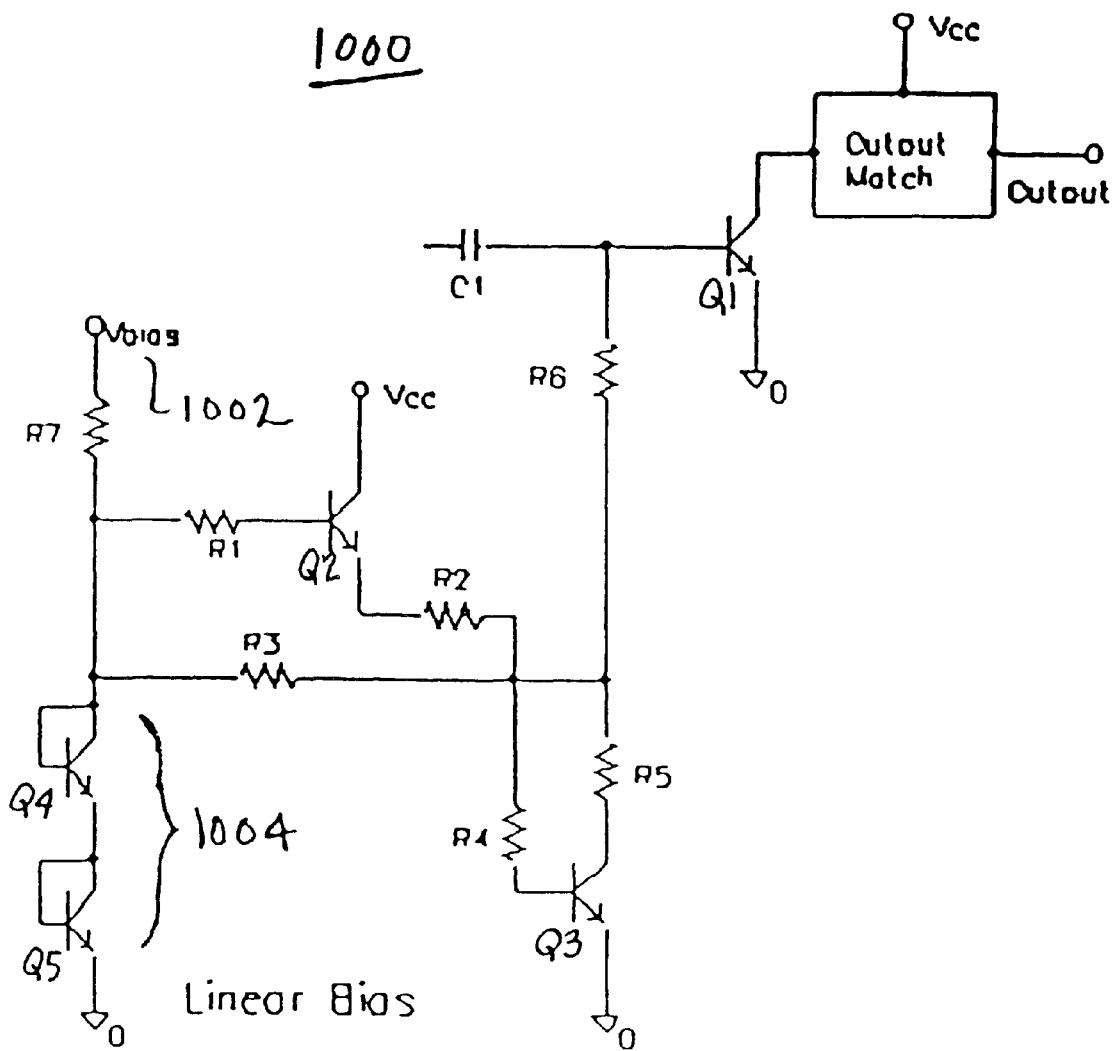
FIG. 10 is a schematic diagram illustrating a current bias network according to another embodiment of the present invention.

FIG. 10 is a schematic diagram illustrating another bias network 1000 according to another embodiment of the present invention. The bias network 1000 is similar to the bias network 900 illustrated in FIG. 9, except the bias voltage source Vbias 1002 is combined with a pair of diode connected transistors 1004 to generate a desired bias voltage on the integrated circuit (IC) chip. This embodiment is not so limited however, and it shall be understood that a desired bias voltage can also be generated by replacing the pair of diode connected transistors 1004 with a single transistor, one or more diodes, or combinations thereof. One or more resistors can also be combined with the transistor(s) and/or diode(s) to more particularly refine the desired bias voltage characteristics.

Figure 11:
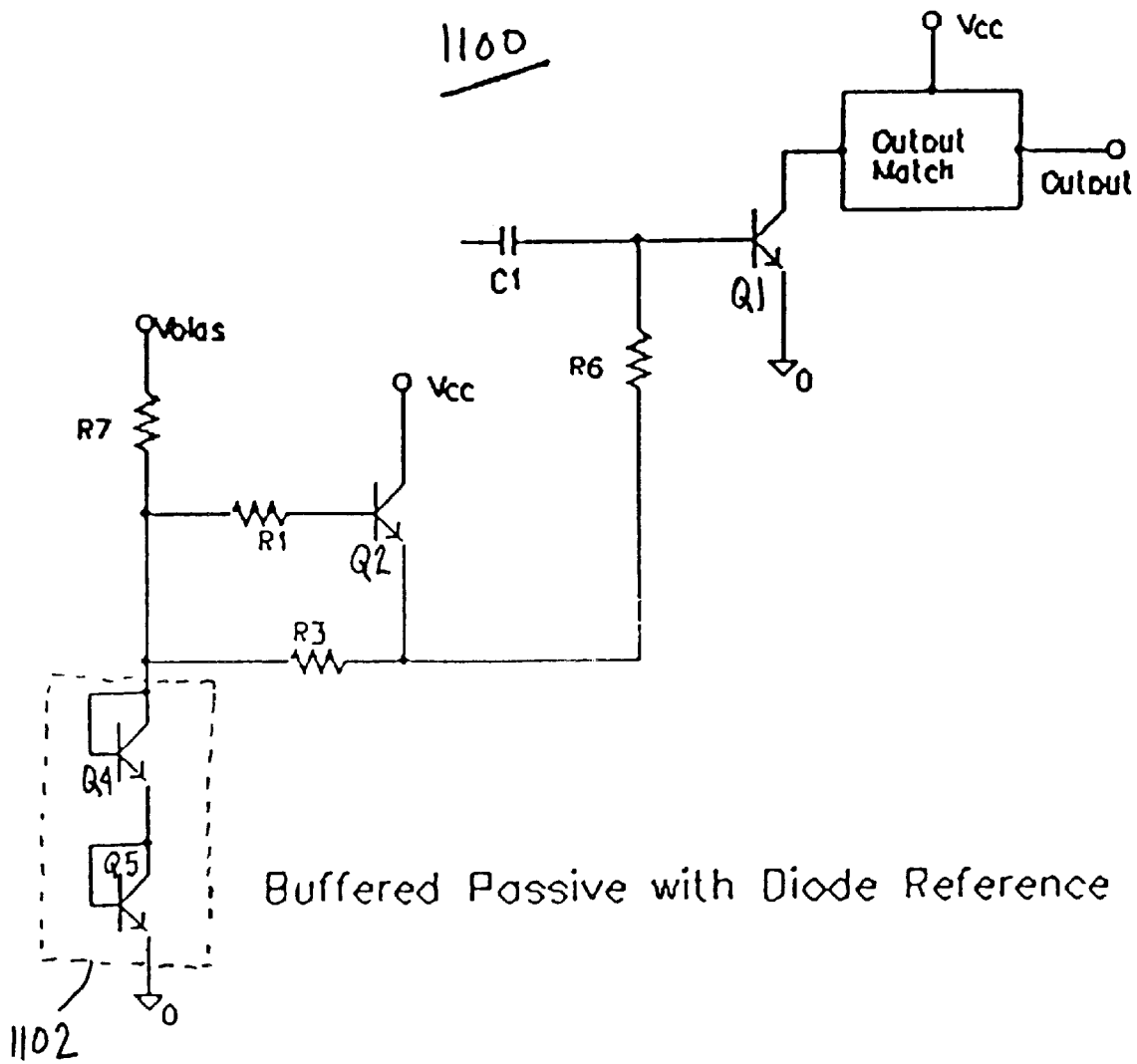
FIG. 11 is a schematic diagram illustrating another bias network known in the art.

FIG. 11 is a schematic diagram illustrating a buffered passive bias circuit 1100 that is known in the art. The bias circuit 1100 uses two diode connected transistors 1102 to provide a temperature variable reference voltage. Other implementations of the bias circuit 1100 known in the art employ a single transistor in combination with a resistor to provide a reference voltage. As stated above, a classic buffered passive bias circuit such as circuit 1100 tends to produce undesirable gain expansion under some circumstance when used to bias a linear amplifier. One embodiment of the present invention minimizes undesirable gain expansion by adding a properly sized resistor to the emitter of the active transistor associated with the buffered passive bias circuit such as illustrated in FIGS. 5 and 6. The newly added emitter resistor operates to improve linearity by strategically maximizing the bias circuit impedance at a desired operating point.

Figure 12:
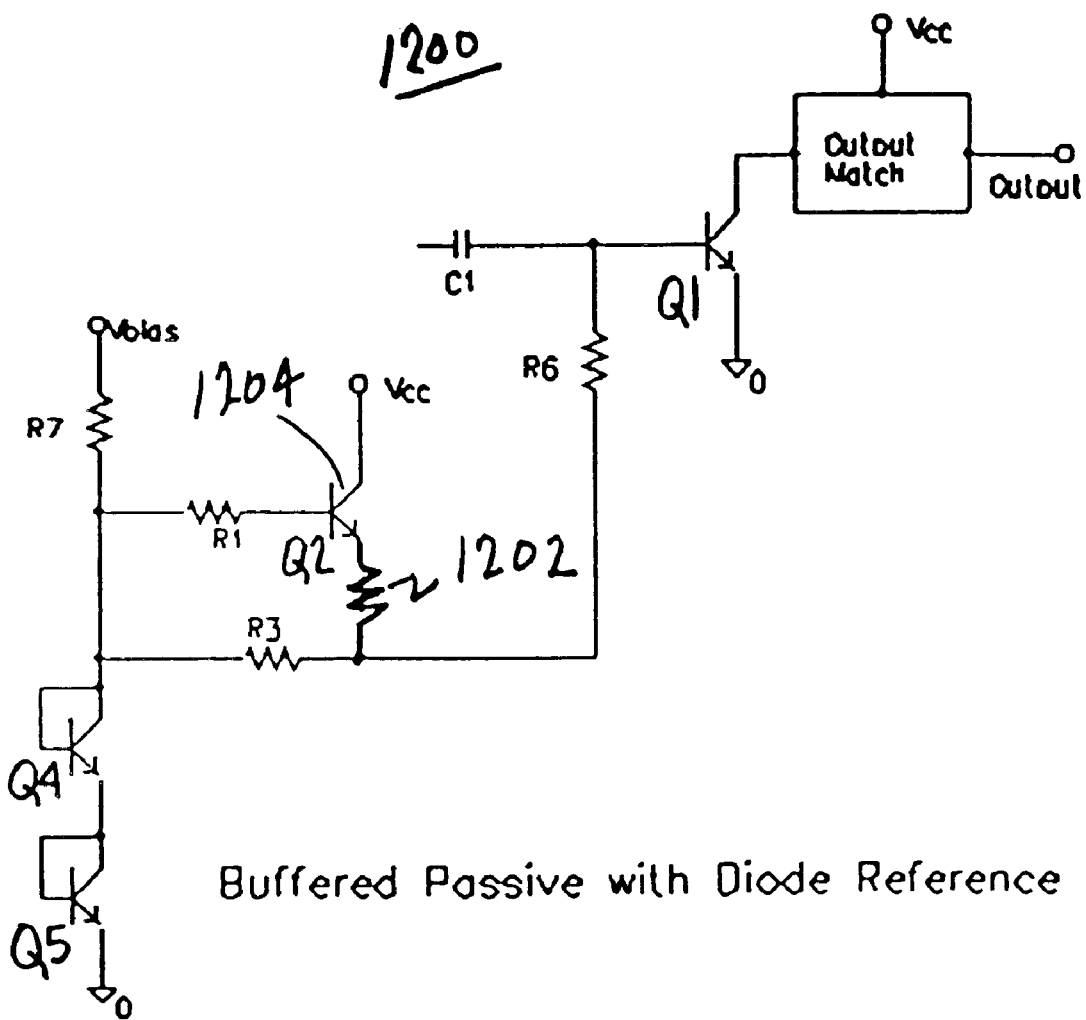
FIG. 12 is a schematic diagram illustrating another modified current bias network according to one embodiment of the present invention.

FIG. 12 is a schematic diagram illustrating a modified buffered passive bias circuit 1200 according to one embodiment of the present invention. The bias circuit 1200 is like the bias circuit 1100 shown in FIG. 11, except an additional impedance adjustment resistor 1202 is added to the emitter of the bias circuit transistor 1204 to improve linearity by minimizing gain expansion as stated above. Although the modified buffered passive bias circuit 1200 is an improvement over classic buffered passive bias schemes known in the art, a more preferred scheme uses any of the bias networks shown in FIGS. 9 and 10. As stated above, improvements in linearity and operating efficiency can be obtained when using a combination of resistive biasing, active biasing and current mirror biasing. This combination of bias schemes can therefore be used in combination with a linear amplifier to provide a linear amplifier with superior linearity and operating efficiency when contrasted with known bias schemes.

Figure 13:
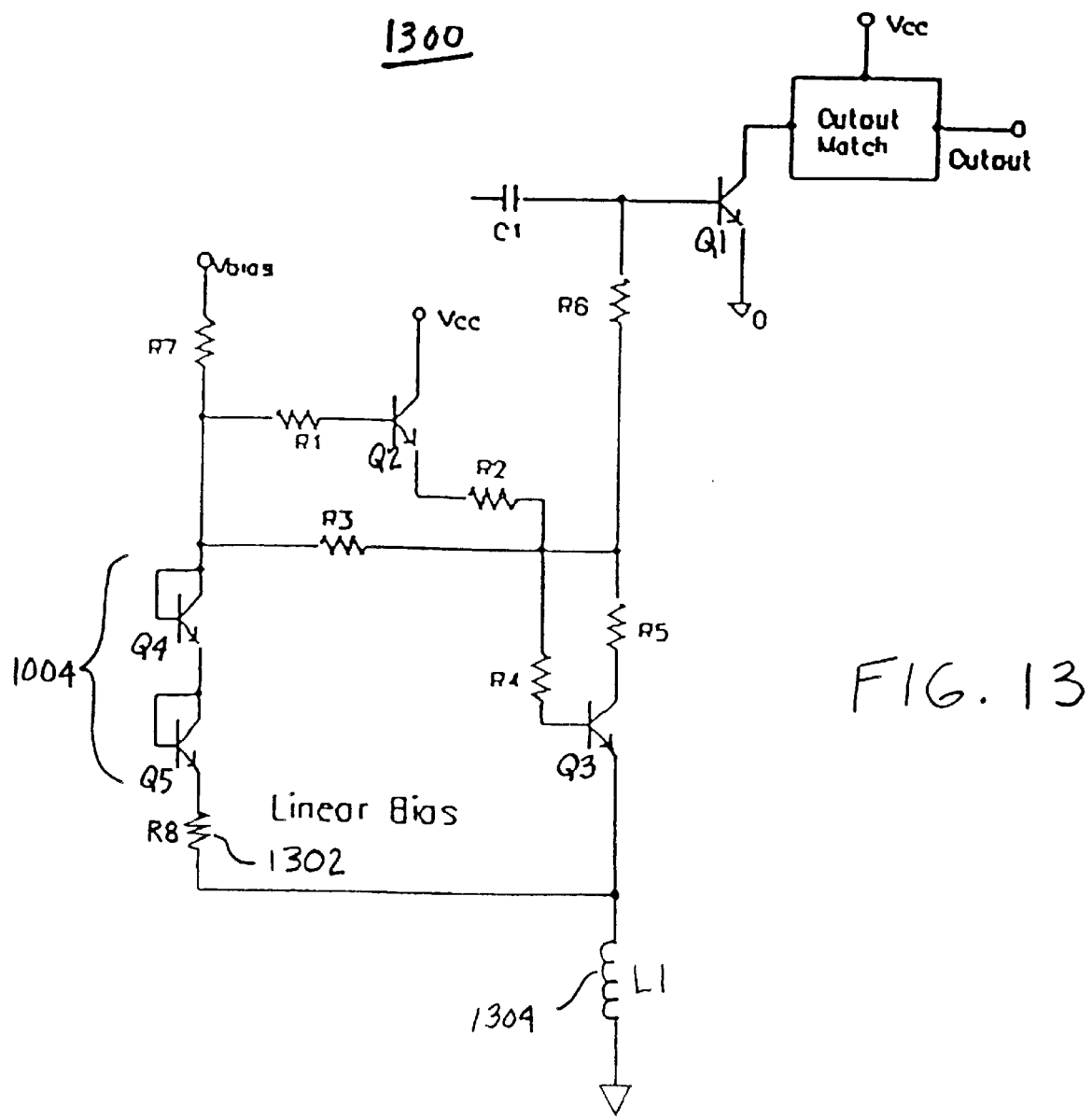
FIG. 13 is a schematic diagram illustrating a current bias network according to anther embodiment of the present invention.

FIG. 13 is a schematic diagram illustrating a bias network 1300 according to another embodiment of the present invention. The bias network 1300 is similar to the bias network 1000 illustrated in FIG. 10, except the bias voltage source Vbias 1004 is formulated with a pair of diode connected transistors 1004 and a series resistor 1302 to generate a desired bias voltage on the integrated circuit (IC) chip. Those skilled in the art shall readily appreciate that a desired bias voltage can also be generated by replacing the pair of diode connected transistors 1004 with a single transistor, more than two transistors, one or more diodes, or combinations thereof. More than a single series resistor can also be combined with the transistor(s) and/or diode(s) to more particularly refine the desired bias voltage characteristics. The bias network 1300 is optionally coupled to ground via an inductor 1304 that functions to alter the AC impedance characteristics of the bias network 1300.

Certain modifications and improvements will occur to those skilled in the art upon a reading of the foregoing description. By way of example, just as the inventive embodiments disclosed herein describe specific combinations of bias networks, different combinations are possible with reduced, but yet superior performance over classic bias networks known in the art. The present invention is also useful in combination with many other types of circuits beyond merely linear amplifiers. Further, the present invention can be constructed using various combinations of the circuit elements, so long as the requisite resistor(s) and/or inductor(s) are present to tailor the impedance of the particular bias network. It should be understood that all such modifications and improvements have been deleted herein for the sake of conciseness and readability but are properly within the scope of the following claims.

We claim:

1. A linear amplifier bias network comprising:
    a radio frequency bipolar junction transistor having a base, collector and emitter;
    a capacitor having one end coupled to the base of the radio frequency bipolar junction transistor and having an opposite end configured to receive a radio frequency input signal;
    a buffered passive bias network having a first bipolar junction transistor and further having an emitter resistor associated with the first bipolar junction transistor; and
    a current mirror bias network coupled to the buffered passive bias network, the current mirror bias network having a second bipolar junction transistor and further having a collector resistor and a base resistor associated with the second bipolar junction transistor; wherein a combination of resistance values for the emitter, base and collector resistors are capable of adjusting a bias impedance associated with the bias network such that the bias network can achieve a desired temperature compensation characteristic and further such that the bias network can achieve a desired level of quiescent current and minimize gain expansion associated with the radio frequency bipolar junction transistor.

2. The linear amplifier bias network according to claim 1 further comprising an inductor having a first end coupled to a ground node and further having an opposite end coupled to the emitter of the second bipolar junction transistor such that the emitter of the second bipolar junction transistor is coupled to the ground node solely through the inductor.

3. The linear amplifier bias network according to claim 2 wherein any single resistor selected from the group consisting of the emitter resistor, the collector resistor and the base resistor is configured to have zero resistance.

4. The linear amplifier bias network according to claim 1 further comprising:
    a supply voltage node;
    a ground node;
    a diode network; and
    a resistor having a first end coupled to the supply voltage node and having an opposite end coupled to the diode network such that a predetermined voltage drop is achieved across the diode network relative to the ground node to produce a desired bias voltage for the linear amplifier bias network.

5. The linear amplifier bias network according to claim 4 wherein the diode network includes a plurality of diodes and a series resistor.

6. The linear amplifier bias network according to claim 5 further comprising an inductor having a first end coupled to the ground node and further having an opposite end coupled to the diode network such that a portion of the diode network is coupled to the ground node solely through the inductor.

7. The linear amplifier bias network according to claim 6 wherein any single resistor selected from the group consisting of the emitter resistor, the collector resistor and the base resistor is configured to have zero resistance.

8. The linear amplifier bias network according to claim 1 further comprising:
    a supply voltage node;
    a ground node;
    a transistor network configured as a diode network; and
    a resistor having a first end coupled to the supply voltage node and having an opposite end coupled to the transistor network such that a predetermined voltage drop is achieved across the transistor network relative to the ground node to produce a desired bias voltage for the linear amplifier bias network.

9. The linear amplifier bias network according to claim 8 wherein the transistor network includes a plurality of bipolar junction transistors and a series resistor.

10. The linear amplifier bias network according to claim 9 further comprising an inductor having a first end coupled to the ground node and further having an opposite end coupled to the transistor network such that a portion of the transistor network is coupled to the ground node solely through the inductor.

11. The linear amplifier bias network according to claim 10 wherein any single resistor selected from the group consisting of the emitter resistor, the collector resistor and the base resistor is configured to have zero resistance.

12. A linear amplifier bias network comprising:

a radio frequency bipolar junction transistor having a base, collector and emitter;

a capacitor having one end coupled to the base of the radio frequency bipolar junction transistor and having an opposite end configured to receive a radio frequency input signal;

a buffered passive bias network having a first bipolar junction transistor and further having at least one emitter resistor associated with the first bipolar junction transistor; and a current mirror bias network coupled to the buffered passive bias network, the current mirror bias network having a second bipolar junction transistor and further having at least one emitter inductor associated with the second bipolar junction transistor; wherein a combination of impedance values for the at least one emitter resistor and at least one emitter inductor are capable of adjusting a bias impedance associated with the bias network such that the bias network can achieve a desired temperature compensation characteristic and further such that the bias network can achieve a desired level of quiescent current associated with the radio frequency bipolar junction transistor.

13. A linear amplifier bias network comprising:

a radio frequency bipolar junction transistor having a base, collector and emitter;

a capacitor having a first end coupled to the base of the radio frequency bipolar junction transistor and having an opposite end configured to receive a radio frequency input signal;

an active bias network having a first bipolar junction transistor and a base resistor;

means for establishing an impedance in the emitter leg of the first bipolar junction transistor to achieve a desired level of quiescent bias current associated with the radio frequency bipolar junction transistor, wherein the means for establishing the impedance is independent of the base resistor;

first means for establishing an impedance for the linear amplifier bias network to achieve a desired first temperature compensation characteristic wherein the first means for establishing an impedance for the linear amplifier bias network is independent of the means for establishing an impedance in the emitter leg of the first bipolar junction transistor and is further independent of the base resistor; and second means for establishing an impedance for the linear amplifier bias network to achieve a desired second temperature compensation characteristic wherein the second means for establishing an impedance for the linear amplifier bias network is independent of the first means and the means for establishing an impedance in the emitter leg of the first bipolar junction transistor and is further independent of the base resistor.

14. The linear amplifier bias network according to claim 13 wherein the second means comprises a bipolar junction transistor having a base, a collector and an emitter, and further comprising an inductor having a first end coupled to the emitter of the bipolar junction transistor and having an opposite end coupled to a ground.

* * * * *